(12) United States Patent
Fujikawa

(10) Patent No.: US 10,908,442 B1
(45) Date of Patent: Feb. 2, 2021

(54) ELECTRO-OPTICAL DEVICE AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/930,628

(22) Filed: Jul. 16, 2020

(30) Foreign Application Priority Data

Jul. 17, 2019 (JP) .................................. 2019-131746

(51) Int. Cl.
| G02F 1/1333 | (2006.01) |
| H05K 1/14 | (2006.01) |
| G02F 1/1345 | (2006.01) |
| H05K 3/36 | (2006.01) |
| G02F 1/155 | (2006.01) |

(52) U.S. Cl.
CPC ...... *G02F 1/133305* (2013.01); *G02F 1/1345* (2013.01); *G02F 1/155* (2013.01); *H05K 1/147* (2013.01); *H05K 3/36* (2013.01); *G02F 2201/123* (2013.01); *H05K 2201/20* (2013.01)

(58) Field of Classification Search
None
See application file for complete search history.

(56) References Cited

U.S. PATENT DOCUMENTS

| 5,729,050 A | 3/1998 | Kim |
| 2012/0236514 A1 | 9/2012 | Saimen |
| 2018/0226326 A1 | 8/2018 | Uchiyama |

FOREIGN PATENT DOCUMENTS

| JP | H06-112363 A | 4/1994 |
| JP | H09-330997 A | 12/1997 |
| JP | 2001-148547 A | 5/2001 |
| JP | 2005-257977 A | 9/2005 |
| JP | 2012-194242 A | 10/2012 |
| JP | 2012-194323 A | 10/2012 |
| JP | 2012-194326 A | 10/2012 |
| JP | 2015-018934 A | 1/2015 |
| JP | 5782013 B2 | 9/2015 |
| JP | 2016-001311 A | 1/2016 |
| JP | 2018-128488 A | 8/2018 |

*Primary Examiner* — Richard H Kim
(74) *Attorney, Agent, or Firm* — Oliff PLC

(57) ABSTRACT

In an electro-optical device, a flexible first wiring substrate and a flexible second wiring substrate, which are respectively coupled to a first terminal region and a second terminal region, extend while overlapping with each other, and a first mold material is provided between the first wiring substrate and the second wiring substrate. The second wiring substrate includes a base film having transmissivity, a wiring line provided at the base film, and a protective layer that covers the wiring line and is less transmissive than the base film. In the second wiring substrate, a light-transmission window in which the wiring line and the protective layer are not present in part is provided in a region thereof overlapping with the first mold material.

12 Claims, 10 Drawing Sheets

ELECTRO-OPTICAL DEVICE AND ELECTRONIC APPARATUS

The present application is based on, and claims priority from JP Application Serial Number 2019-131746, filed Jul. 17, 2019, the disclosure of which is hereby incorporated by reference herein in its entirety.

BACKGROUND

1. Technical Field

The present disclosure relates to an electro-optical device in which a flexible wiring substrate is coupled to an electro-optical device substrate, and an electronic apparatus.

2. Related Art

In an electro-optical device, such as a liquid crystal display device and an organic electroluminescence device, it is conceivable to adopt a structure in which a flexible first wiring substrate and a flexible second wiring substrate are respectively coupled to a first terminal region and a second terminal region of an electro-optical device substrate (see JP-A-2012-194323). Further, in the electro-optical device described in JP-A-2012-194323, a space from between the first wiring substrate and the second wiring substrate to between the first terminal region and the second terminal region is sealed using a mold material, and a space, from the side of the first wiring substrate opposite to the second wiring substrate, to the first terminal region is also sealed using the mold material.

In a flexible wiring substrate used as each of the first wiring substrate and the second wiring substrate, a protective layer that is less transmissive than a base film may be provided so as to cover wiring lines provided at the transmissive base film. In this case, when the non-cured mold material is applied between the first wiring substrate and the second wiring substrate, since the mold material is blocked by the wiring lines and the protective layer from both the first wiring substrate side and the second wiring substrate side, it is not possible to confirm whether or not the non-cured mold material is provided over an appropriate range. Therefore, when the first wiring substrate and the second wiring substrate are coupled to the electro-optical device substrate in an overlapping manner, there is a problem in that it is difficult to appropriately provide the mold material between the first wiring substrate and the second wiring substrate.

SUMMARY

To solve the above-described problem, an electro-optical device according to an aspect of the present disclosure includes an electro-optical device substrate including a plurality of pixel electrodes arranged in a pixel region, a first terminal region in which a plurality of first terminals are arranged between a substrate edge and the pixel region, along the substrate edge, and a second terminal region in which a plurality of second terminals are arranged between the first terminal region and the pixel region, along the substrate edge, a flexible first wiring substrate coupled to the first terminal region, a flexible second wiring substrate coupled to the second terminal region, and extending while overlapping with the first wiring substrate, and a first mold material provided from between the first wiring substrate and the second wiring substrate to between the first terminal region and the second terminal region. Each of the first wiring substrate and the second wiring substrate includes a base film having transmissivity, a wiring line provided at the base film, and a protective layer that covers the wiring line and is less transmissive than the base film. In one wiring substrate of the first wiring substrate and the second wiring substrate, a light-transmission window in which the wiring line and the protective layer are not present in part is provided in a region overlapping with the first mold material in a range in which the protective layer and the wiring line are provided in an extending direction of the one wiring substrate.

An electro-optical device according to another aspect of the present disclosure includes an electro-optical device substrate including a plurality of pixel electrodes arranged in a pixel region, a first terminal region in which a plurality of first terminals are arranged between a substrate edge and the pixel region, along the substrate edge, and a second terminal region in which a plurality of second terminals are arranged between the first terminal region and the pixel region, along the substrate edge, a flexible first wiring substrate coupled to the first terminal region, a flexible second wiring substrate coupled to the second terminal region, and extending while overlapping with the first wiring substrate, and a first mold material provided from between the first wiring substrate and the second wiring substrate to between the first terminal region and the second terminal region. Each of the first wiring substrate and the second wiring substrate includes a base film, a wiring line provided at the base film, and a protective layer covering the wiring line. In one wiring substrate of the first wiring substrate and the second wiring substrate, a light-transmission window formed by a through hole is provided in a region overlapping with the first mold material in a range in which the protective layer and the wiring line are provided in an extending direction of the one wiring substrate.

The electro-optical device according to the aspect of the present disclosure can be used for various electronic apparatuses. When an electronic apparatus is a projection-type display apparatus, the projection-type electronic apparatus includes a light source unit that emits light supplied to the electro-optical device, and a projection optical system that projects light modulated by the electro-optical device.

DESCRIPTION OF EXEMPLARY EMBODIMENTS

Figure 1:
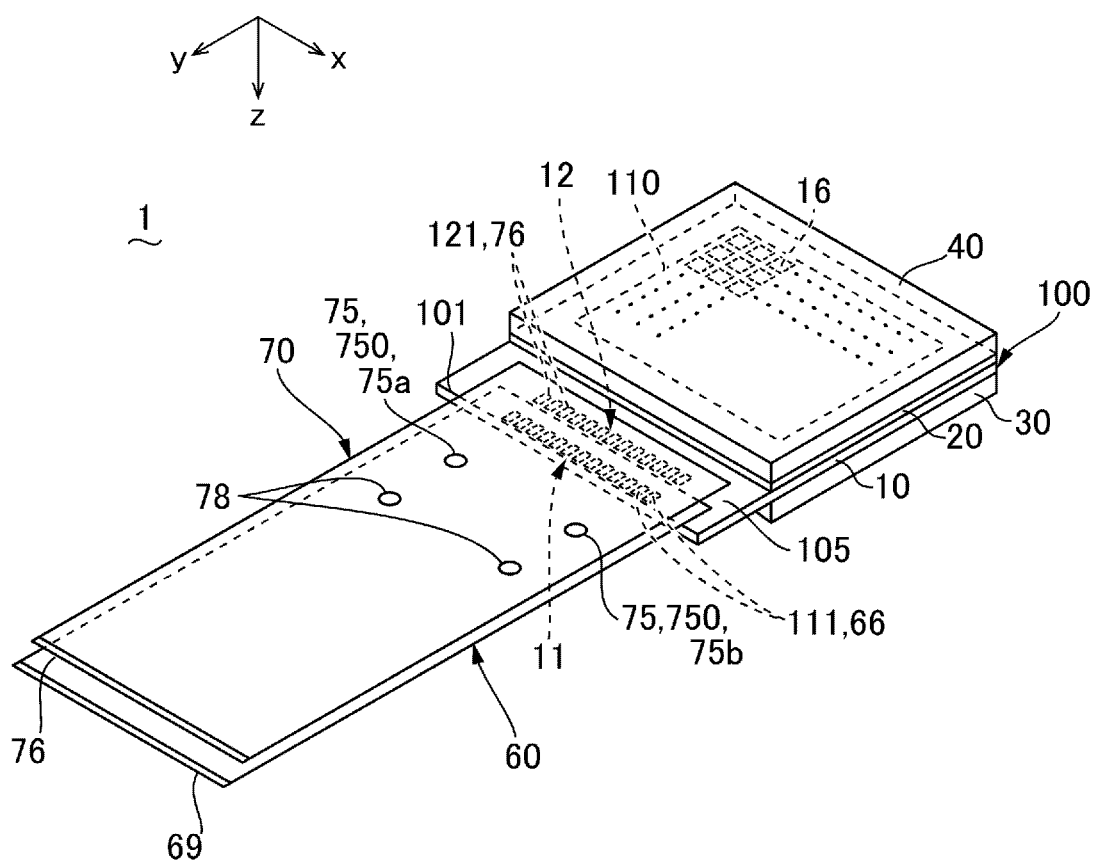
FIG. 1 is a perspective view illustrating a mode of an electro-optical device according to a first exemplary embodiment of the present disclosure.

Exemplary embodiments of the present disclosure will be described below with reference to the drawings. Note that, in the drawings to be referenced in the description below, to make each of members and the like recognizable in terms of size in the drawings, each of the members are illustrated in different scales, and a number of each of the members is reduced. In the description below, directions are expressed using an orthogonal coordinate system consisting of an x-axis, a y-axis, and a z-axis. The z-axis direction is a thickness direction of an electro-optical device 1, the y-axis direction is an extending direction of wiring substrates, and the x-axis direction is a width direction orthogonal to the extending direction of the wiring substrates.

First Exemplary Embodiment

Basic Configuration

Figure 2:
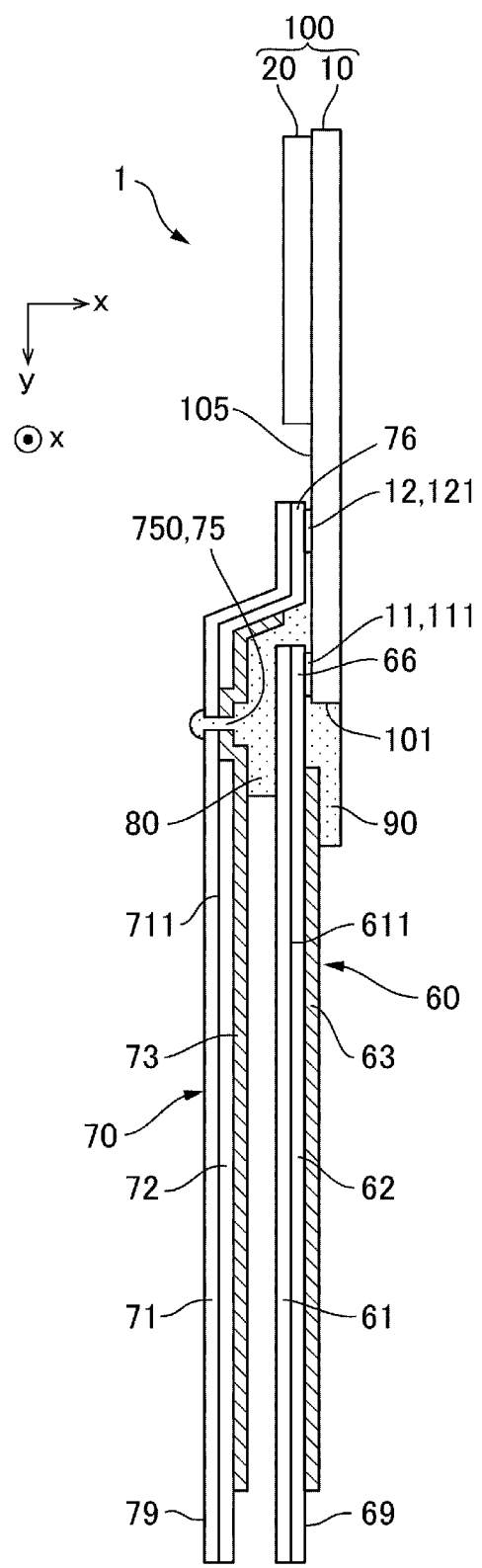
FIG. 2 is an explanatory diagram schematically illustrating a cross-section of the electro-optical device illustrated in FIG. 1.

FIG. 1 is a perspective view illustrating a mode of the electro-optical device 1 according to a first exemplary embodiment of the present disclosure. FIG. 2 is an explanatory diagram schematically illustrating a cross-section of the electro-optical device 1 illustrated in FIG. 1, and corresponds to a cross-sectional view taken along a dotted line A-A' in FIG. 3A, which will be described below. Note that in FIG. 2, a seal material, an electro-optical layer, a first dust-proof glass 30, a second dust-proof glass 40, and the like are not illustrated.

In FIG. 1 and FIG. 2, the electro-optical device 1 is a liquid crystal device used as a light valve or the like, which will be described below, and includes a liquid crystal panel that is an electro-optical panel 100. In the electro-optical panel 1, a counter substrate 20 on which a common electrode (not illustrated) and the like are formed is bonded, using the seal material (not illustrated), to an electro-optical device substrate 10 (an element substrate) on which pixel electrodes 16 and the like are formed. In the electro-optical panel 1, a liquid crystal layer (not illustrated) is provided in a region surrounded by the seal material. The electro-optical panel 1 of the present exemplary embodiment includes the transmissive first dust-proof glass 30 that is layered and bonded, via an adhesive or the like, onto a surface, opposite from the counter substrate 102, of the electro-optical device substrate 10, and the transmissive second dust-proof glass 40 that is layered and bonded, via the adhesive or the like, onto a surface, opposite from the electro-optical device substrate 10, of the counter substrate 20. In the electro-optical device 1, a region in which the pixel electrodes 16 are arranged in the x-axis direction and the y-axis direction is a pixel region 110, and a display region is configured by all or a part of the pixel region 110.

The electro-optical device substrate 10 includes a protruding portion 105 protruding in the y-axis direction from an end portion of the counter substrate 20. The protruding portion 105 is provided with a first terminal region 11 in which a plurality of first terminals 111 are arranged at a predetermined pitch along a substrate edge 101 of the electro-optical device substrate 10. In addition, the protruding portion 105 is provided with a second terminal region 12 in which a plurality of second terminals 121 are arranged at a predetermined pitch along the substrate edge 101, and the second terminal region 12 is provided between the first terminal region 11 and the pixel region 110.

The electro-optical device 1 includes a flexible first wiring substrate 60 that is coupled to the first terminal region 11 and a flexible second wiring substrate 70 that is coupled to the second terminal region 12. The first wiring substrate 60 extends in the y-axis direction so as to separate from the electro-optical device substrate 10, and the second wiring substrate 70 extends in the y-axis direction in a state of overlapping with the first wiring substrate 60 from the counter substrate 20 side in the z-axis direction.

The first wiring substrate 60 and the second wiring substrate 70 respectively include terminal regions 69 and 79 in end portions thereof on the opposite side from a side coupled to the electro-optical device substrate 10. In the terminal regions 69 and 79, terminals are provided that configure a board-to-board connector and the like. A driving IC may be mounted on the first wiring substrate 60 and the second wiring substrate 70.

The electro-optical panel 100 of the present exemplary embodiment is a transmission-type liquid crystal panel. Therefore, the electro-optical device substrate 10 and the counter substrate 20 are each formed by a transmissive substrate, such as heat-resistant glass and a quartz substrate. In the electro-optical device 1 configured in this manner, for example, illumination light incident from one of the electro-optical device substrate 10 and the counter substrate 20 is modulated while exiting from a side of the other substrate, and emitted as display light.

Configuration of First Wiring Substrate 60 and Second Wiring Substrate 70

As illustrated in FIG. 2, the first wiring substrate 60 and the second wiring substrate 70 are both disposed such that first surfaces 611 and 711, on which wiring lines 62 and 72 are respectively formed, are oriented toward the electro-optical device substrate 10 in the z-axis direction. More specifically, the first wiring substrate 60 includes a base film 61 that is transmissive and flexible, the wiring lines 62 provided extending in the y-axis direction on the first surface 611 of the base film 61, and a protective layer 63 that covers the wiring lines 62. An end portion of the wiring line 62 on the electro-optical device substrate 10 side forms a first electrode 66 coupled to the first terminal 111, and an end portion of the wiring line 62 on the opposite side from the electro-optical device substrate 10 configures the terminals in the terminal region 69. The protective layer 63 is formed over substantially the whole region of the first wiring substrate 60, except for both end portions thereof in the y-axis direction. Therefore, for electrical coupling, the protective layer 63 is not formed in a region overlapping with the first electrode 66 and a region overlapping with the terminal region 69.

Similarly to the first wiring substrate 60, the second wiring substrate 70 includes a base film 71 that is transmissive and flexible, the wiring lines 72 provided extending in the y-axis direction on the first surface 711 of the base film 71, and a protective layer 73 that covers the wiring lines 72. An end portion of the wiring line 72 on the electro-optical device substrate 10 side forms a second electrode 76 coupled to the second terminal 121, and an end portion of the wiring line 72 on the opposite side from the electro-optical device substrate 10 configures the terminals in the terminal region 79. The protective layer 73 is formed over substantially the whole region of the second wiring substrate 70, except for both end portions thereof in the y-axis direction. Therefore, for electrical coupling, the protective layer 73 is not formed in a region overlapping with the second electrode 76 and a region overlapping with the terminal region 79.

In the first wiring substrate 60 and the second wiring substrate 70 configured in this manner, the base films 61 and 71 are transmissive resin films formed of polyimide or the like. The wiring lines 62 and 72 are metal layers, such as copper layers, respectively layered on the base films 61 and 71 with an adhesive layer interposed therebetween, and have light-shielding properties. The protective layers 63 and 73 are respectively provided above the wiring lines 62 and 72 so as to cover the wiring lines 62 and 72, and the protective layers 63 and 73 are less transmissive than the base films 61 and 71. For example, the protective layers 63 and 73 are formed of colored resin layers and are less transmissive than the base films 61 and 71. Examples of a method for forming the protective layers include "film coverlay", "photo-soldering resist ink", and the like. The method for forming the protective layers is selected while taking into consideration the bending resistance and the like required for the wiring substrates. A typical example of the external appearance color of the protective layer appears brownish when the "film coverlay" is used, and appears greenish when the "photo-soldering resist ink" is used. In recent years, the "photo-soldering resist ink" may be colored "white", "black", or the like in order to improve the design of the interior of an apparatus, or to make a wiring pattern analysis of the wiring substrate difficult.

Configuration of First Mold Material 80 and Second Mold Material 90

In the present exemplary embodiment, a first mold material 80 is provided from a space between the first wiring substrate 60 and the second wiring substrate 70 to a space between the first terminal region 11 and the second terminal region 12. The first mold material 80 covers the end portion of the first wiring substrate 60 on the electro-optical device substrate 10 side, protects the first terminal region 11 from moisture, dust, or the like on the second terminal region 12 side, and also reinforces a coupling section between the first terminal region 11 and the first wiring substrate 60. Further, the first mold material 80 covers the space between the first terminal region 11 and the second terminal region 12, protects the second terminal region 12 from moisture, dust, or the like on the first terminal region 11 side, and also reinforces a coupling section between the second terminal region 12 and the second wiring substrate 70.

In the present exemplary embodiment, a second mold material 90 is provided from a surface, on the opposite side from the second wiring substrate 70, of the first wiring substrate 60 to the first terminal region 11. The second mold material 90 covers a portion of the first wiring substrate 60 that is exposed from the electro-optical device substrate 10 side, protects the first terminal region 11 from moisture, dust, or the like on the substrate edge 101 side, and also reinforces the coupling section between the first terminal region 11 and the first wiring substrate 60.

Note that a third mold material (not illustrated) may be provided so as to cover the end portion of the second wiring substrate 70 on the electro-optical device substrate 10 side, from a surface, on the side opposite from the first wiring substrate 60, of the second wiring substrate 70.

Configuration of Light-Transmission Window 75

Figure 3A:
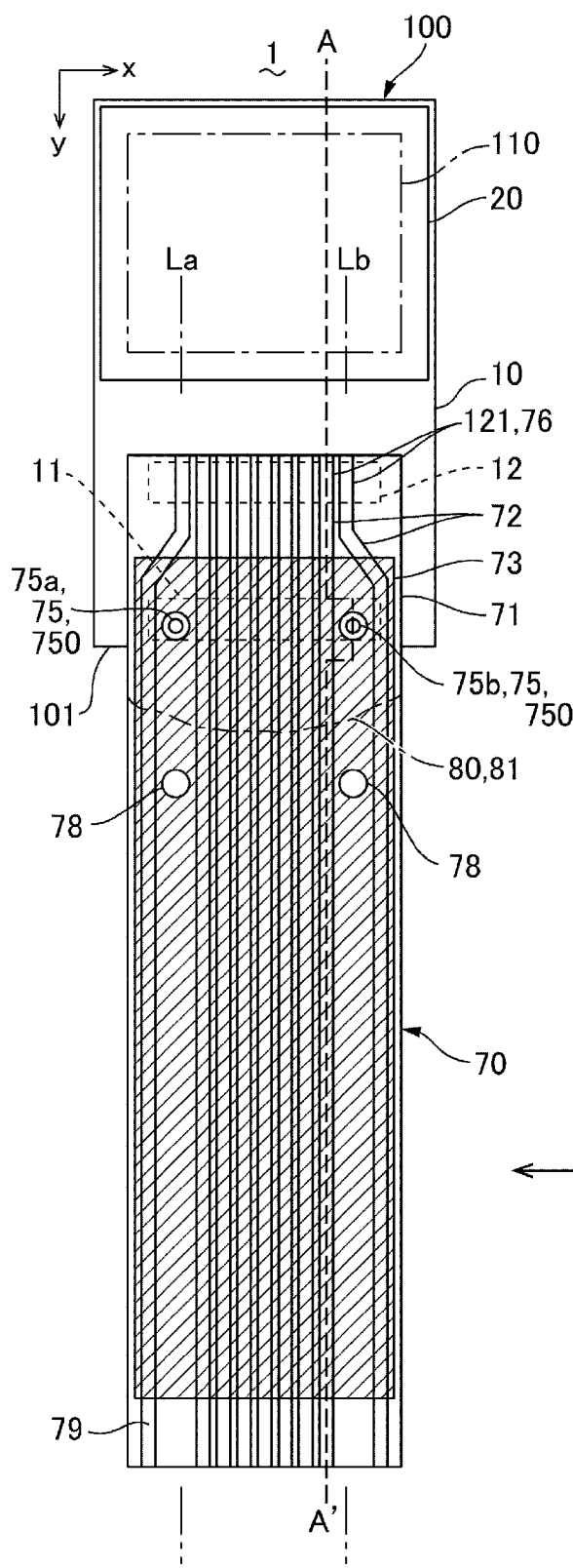
FIGS. 3A and 3B are explanatory diagrams each illustrating a planar configuration of a second wiring substrate and the like illustrated in FIG. 2.
Figure 3B:
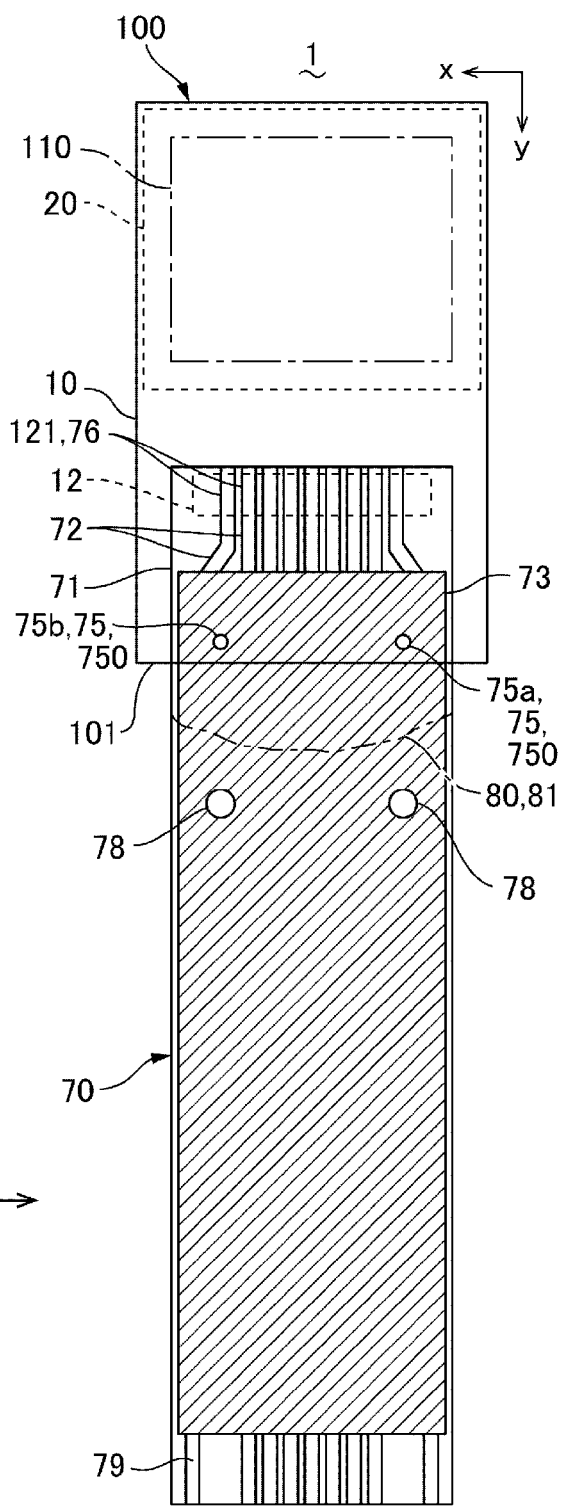

FIGS. 3A and 3B are explanatory diagrams each illustrating a planar configuration of the second wiring substrate 70 and the like illustrated in FIG. 2. FIG. 3A illustrates a plan view of the second wiring substrate 70 and the like as viewed from the counter substrate 20 side, and FIG. 3B illustrates a bottom surface view of the second wiring substrate 70 and the like as viewed from the electro-optical device substrate 10 side. Note that in FIGS. 3A and 3B, an illustration of the first wiring substrate 60 is omitted. Further, in FIGS. 3A and 3B, of the second wiring substrate 70, visible portions are indicated by solid lines.

As illustrated in FIG. 2 and FIGS. 3A and 3B, in "one wiring substrate" of the first wiring substrate 60 and the second wiring substrate 70, a "light-transmission window" in which the wiring lines and the protective layer are not present in part, is provided in a region overlapping with the first mold material 80, of a range in which the wiring lines and the protective layer are provided in the extending direction of the "one wiring substrate".

In the present exemplary embodiment, as will be described below, the "one wiring substrate" is the second wiring substrate 70, and the second wiring substrate 70 is provided with light-transmission windows 75 in which the wiring lines 72 and the protective layer 73 are not present in part, in the region overlapping with the first mold material 80, of the range in which the wiring lines 72 and the protective layer 73 are provided in the extending direction of the second wiring substrate 70. More specifically, although a plurality of the wiring lines 72 extend in the y-axis direction in the second wiring substrate 70, for some of the plurality of wiring lines 72, there is a wide gap between the adjacent wiring lines 72, and a region thus exists in which the wiring lines 72 are not present. In the present exemplary embodiment, the light-transmission windows 75 in which the protective layer 73 is not present are provided in the region overlapping with the first mold material 80, of the region in which the wiring lines 72 do not exist. The light-transmission window 75 has a circular shape having a diameter of 0.5 mm or less, for example.

In the present exemplary embodiment, the light-transmission window 75 is a through hole 750 in which the base film 71 is not present. For example, the through hole 750 is formed by hollowing-out processing or laser machining in a manufacturing process of the second wiring substrate 70. A portion of the first mold material 80 protrudes from the through hole 750 toward the opposite side from the first wiring substrate 60 while forming a substantially hemispherical shape. Further, at least a portion of the interior of the through hole 750 may be filled with the first mold material 80.

Here, the light-transmission windows 75 are provided in a plurality of locations that are separated from each other at least in the width direction (the x-axis direction) that intersects the extending direction of the second wiring substrate 70. The plurality of locations include a position on a virtual straight line La extending from the second terminal 121 positioned at one end, in the width direction, of the second terminal region 12 along the extending direction of the second wiring substrate 70, and a position on a virtual straight line Lb extending from the second terminal 121 positioned at the other end, in the width direction, of the second terminal region 12 along the extending direction of the second wiring substrate 70. In the present exemplary embodiment, the light-transmission windows 75 are provided in two locations in the width direction. A light-transmission window 75a, which is one of the two light-transmission windows 75, is positioned on the straight line La, and another light-transmission window 75*b* is positioned on the straight line Lb.

In the present exemplary embodiment, the two light-transmission windows 75 are positioned in the same position in the extending direction of the second wiring substrate 70, and each of the two light-transmission windows 75 is provided in a position overlapping with the electro-optical device substrate 10.

Note that holes 78 for alignment are formed in the second wiring substrate 70 on the opposite side from the electro-optical device substrate 10 with respect to the light-transmission windows 75, and the holes 78 are used for positioning when coupling the second wiring substrate 70 with the electro-optical device substrate 10, and the like. Note that the hole 78 is provided having a configuration suitable for alignment using a mechanical jig. For example, the hole 78 is formed to have a diameter of approximately 1 mm to 3 mm in a position significantly separated from the electro-optical device substrate 10. The periphery of the hole 78 needs to be surrounded by a reinforcing pattern that is formed by the same layer as the wiring lines 72, in order to inhibit tearing or the like from occurring when the mechanical jig is attached to or detached from the hole 78. Thus, the hole 78 requires a relatively large area. Therefore, the hole 78 is positioned at a position significantly separated from the electro-optical device substrate 10, due to restrictions on an arrangement of the wiring pattern of the second wiring substrate 70. Thus, in the present exemplary embodiment, the light-transmission windows 75 are provided separately from the holes 78. As described above, the light-transmission window 75 has the circular shape having the diameter of 0.5 mm or less, for example, and does not need to be surrounded by the reinforcing pattern since the mechanical jig is not attached to nor detached from the light-transmission window 75. In other words, since the light-transmission window 75 can be formed in a small area, an impact on the arrangement of the wiring pattern is small. Therefore, the light-transmission window 75 can be arranged in the second wiring substrate 70 in a position closer to the electro-optical device substrate 10.

Operations and Effects of Present Exemplary Embodiment

In the electro-optical device 1 configured in this manner, when providing the first mold material 80 and the second mold material 90, after coupling each of the first wiring substrate 60 and the second wiring substrate 70 to the electro-optical device substrate 10, a process of applying the first mold material 80 and a process of applying the second mold material 90 are performed sequentially in this order, for example, and then, a process of curing the first mold material 80 and the second mold material 90 is performed. However, the processes of applying and curing the first mold material 80 may be performed first, and then, the processes of applying and curing the second mold material 90 may be performed.

Alternatively, the processes of applying and curing the second mold material 90 may be performed first, and then, the processes of applying and curing the first mold material 80 may be performed. In the present exemplary embodiment, the first mold material 80 and the second mold material 90 are formed of a cold curing resin that can be cured by being left at ambient temperature, for example. However, a thermosetting resin or an ultraviolet-curable resin may also be used for the first mold material 80 and the second mold material 90.

In any of the modes described above, in the process of applying the second mold material 90, the uncured second mold material 90 is applied from the portion of the first wiring substrate 60 that is exposed from the electro-optical device substrate 10, to the first terminal region 11 side of the first wiring substrate 60.

In the process of applying the first mold material 80, after applying the uncured first mold material 80 to a space between the first wiring substrate 60 and the second wiring substrate 70, the uncured first mold material 80 is caused to spread by pressing the first wiring substrate 60 and the second wiring substrate 70 so as to be closer to each other. At this time, as illustrated in FIG. 2, when attempting to observe, from the first wiring substrate 60 side, how far the uncured first mold material 80 has spread, the first mold material 80 is blocked by the wiring lines 62 and the colored protective layer 63 of the first wiring substrate 60. Further, when attempting to observe, from the second wiring substrate 70 side, how far the uncured first mold material 80 has spread, the first mold material 80 is blocked by the wiring lines 72 and the colored protective layer 73 of the second wiring substrate 70. Further, when the first mold material 80 is an almost colorless cold curing resin, the observation is particularly difficult.

However, in the electro-optical device 1 according to the present exemplary embodiment, since the light-transmission windows 75 are formed in a region, of the second wiring substrate 70, in which the first mold material 80 is to be provided, by observing the space between the first wiring substrate 60 and the second wiring substrate 70 through the light-transmission windows 75, it is possible to confirm whether or not an end portion 81 of the uncured first mold material 80 has at least reached the positions in which the light-transmission windows 75 are provided. Therefore, when it is determined that the uncured first mold material 80 has not reached the positions in which the light-transmission windows 75 are provided, the uncured first mold material 80 can be provided up to an appropriate range by further pressing and spreading the uncured first mold material 80. Alternatively, by additionally filling the first mold material 80 and applying a predetermined pressing force, the first mold material 80 can be caused to reach the positions in which the light-transmission windows 75 are provided. The first mold material 80 extends isotropically from a pressing portion. Therefore, the pressing portion is set such that a distance from the pressing portion to the second terminal 121 is substantially equal to a distance from the pressing portion to the light-transmission window 75. Alternatively, the pressing portion is set such that the distance from the pressing portion to the second terminal 121 is slightly less than the distance from the pressing portion to the light-transmission window 75. Since the pressing portion is set in this manner, when the first mold material 80 can be visually verified from the light-transmission windows 75, it can be determined that the first mold material 80 has extended from the pressing portion to the second terminal 121. When the pressing process is performed using a mechanical pressing device including a head that is long in the x-axis direction, variations in the spread of the first mold material 80 caused by the pressing process are reduced, so the determination accuracy is further enhanced. Thus, the sealing using the first mold material 80 can be appropriately performed.

In particular, in the present exemplary embodiment, since the light-transmission window 75 is the through hole 750, when the uncured first mold material 80 reaches the positions in which the light-transmission windows 75 are provided, it is possible to easily determine whether or not the uncured first mold material 80 has reached the positions in which the light-transmission windows 75 are provided, since a portion of the first mold material 80 protrudes from the light-transmission window 75 (the through hole 750) while forming the substantially hemispherical shape. The first mold material 80 protruding from the through hole 750 is a convex portion having a different inclination from that of a flat surface of the second wiring substrate 70 in a peripheral portion of the through hole 750. Therefore, by observing reflected light of the interior light, for example, the presence of the first mold material 80 can be easily confirmed even by visual observation. Further, even when the first mold material 80 does not protrude from the through hole 750, as long as a portion of the through hole 750 is filled with the first mold material 80, the presence of the first mold material 80 can be easily confirmed using a difference in optical reflectance between the base film 71 of the second wiring substrate 70 and the first mold material 80. By using the difference in optical reflectance, even when the first mold material 80 is the colorless and transparent cold curing resin, the presence of the first mold material 80 can be easily confirmed. When the optical reflectance is different, since the presence of the first mold material 80 can be confirmed by photographing the through hole 750 and analyzing an image thereof, this configuration is suitable for mechanical production. As in the present exemplary embodiment, when the light-transmission window 75 is the through hole 750, even when the base film 71 is an opaque material, it is possible to easily determine whether or not the first mold material 80 has reached the through hole 750. The present exemplary embodiment in which the light-transmission window 75 is the through hole 750 can also be applied to a configuration in which wiring layers are provided at both sides of the second wiring substrate 70. In this case, the through hole 750 is a through hole that penetrates a base film, a protective layer formed on one surface of the base film, and a protective layer formed on the other surface of the base film.

Further, since the light-transmission windows 75 are provided in the two locations separated from each other in the width direction, it is possible to confirm that the uncured first mold material 80 has been provided up to the appropriate range in the width direction. Thus, the sealing by the first mold material 80 can also be performed appropriately in the width direction. In particular, in the present exemplary embodiment, the light-transmission window 75a, which is one of the light-transmission windows 75, is positioned on the straight line La, and the light-transmission window 75b, which is the other of the light-transmission windows 75, is positioned on the straight line Lb. Therefore, an entire range in which the second terminals 121 are arranged can be sealed by the first mold material 80.

Second Exemplary Embodiment

Figure 4A:
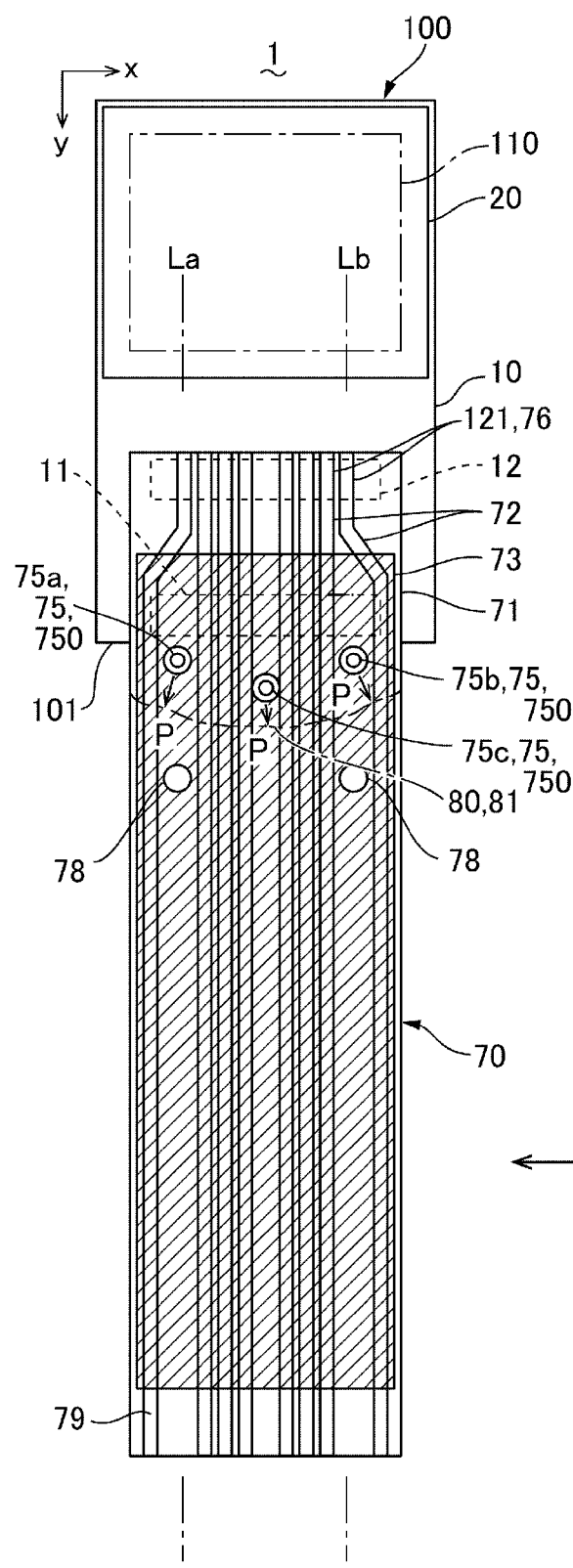
FIGS. 4A and 4B are explanatory diagrams each illustrating the electro-optical device according to a second exemplary embodiment of the present disclosure.
Figure 4B:
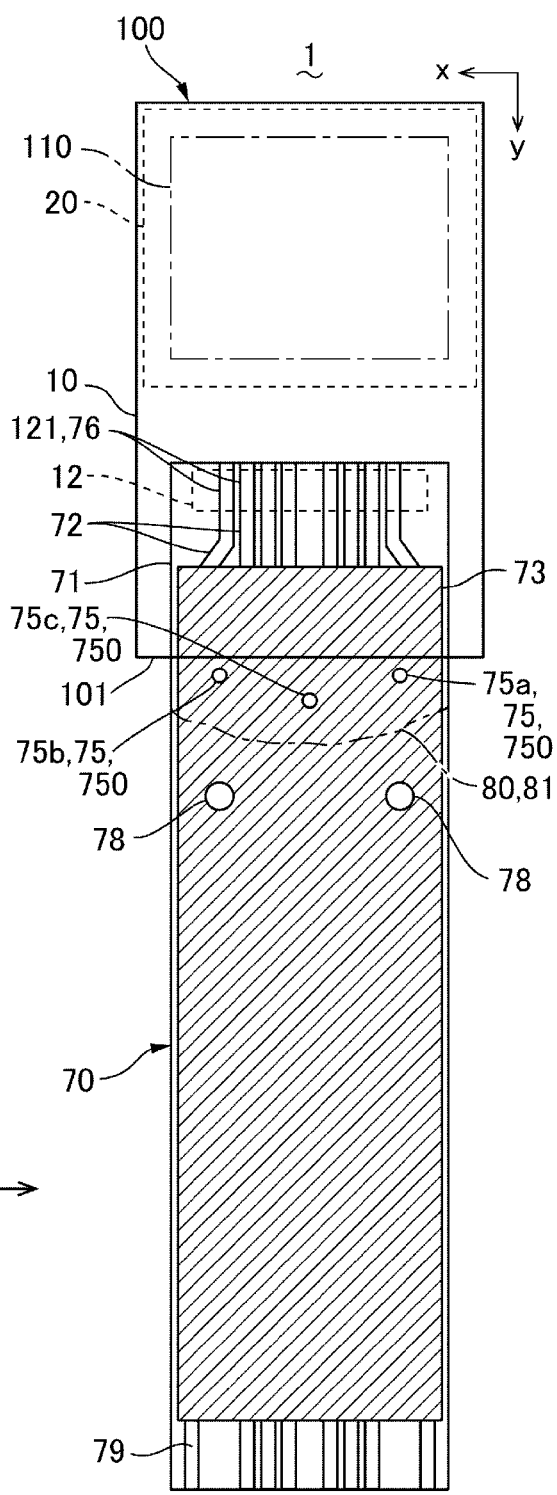

FIGS. 4A and 4B are explanatory diagrams of the electro-optical device 1 according to a second embodiment of the present disclosure. FIG. 4A illustrates a plan view of the second wiring substrate 70 and the like as viewed from the counter substrate 20 side, and FIG. 4B is a bottom surface view of the second wiring substrate 70 and the like as viewed from the electro-optical device substrate 10 side. In FIGS. 4A and 4B, the illustration of the first wiring substrate 60 is omitted. Further, in FIGS. 4A and 4B, of the second wiring substrate 70, visible portions are indicated by solid lines. Note that a basic configuration of the present exemplary embodiment is the same as that of the first exemplary embodiment, and thus, common portions will be denoted by the same reference signs and descriptions thereof will be omitted.

As illustrated in FIGS. 4A and 4B, similarly to the first exemplary embodiment, in the present exemplary embodiment also, the light-transmission windows 75 in which the wiring lines 72 and the protective layer 73 are not present in part are provided in the region overlapping with the first mold material 80 of the range in which the wiring lines 72 and the protective layer 73 are provided in the extending direction of the second wiring substrate 70. Further, the light-transmission window 75 is the through hole 750 in which the base film 71 is not present.

Here, the light-transmission windows 75 are provided in a plurality of locations that are separated from each other in the width direction (the x-axis direction) that intersects the extending direction (the y-axis direction) of the second wiring substrate 70. In the present exemplary embodiment, the light-transmission window 75a is provided on the virtual straight line La extending from the second terminal 121 positioned at the one end in the width direction of the second terminal region 12 along the extending direction of the second wiring substrate 70, and the light-transmission window 75b is provided on the virtual straight line Lb extending from the second terminal 121 positioned at the other end in the width direction of the second terminal region 12 along the extending direction of the second wiring substrate 70. Here, the light-transmission windows 75a and 75b are in the same position in the extending direction of the second wiring substrate 70. In the present exemplary embodiment, the light-transmission windows 75a and 75b are provided in positions that do not overlap with the electro-optical device substrate 10.

Further, in the present exemplary embodiment, the light-transmission windows 75 are provided in the plurality of locations that are separated from each other in the extending direction of the second wiring substrate 70. More specifically, the light-transmission window 75 is also formed as a light-transmission window 75c that is positioned between the light-transmission windows 75a and 75b in the width direction, and the light-transmission window 75c is provided at a position further from the electro-optical device substrate 10 than the light-transmission windows 75a and 75b in the extending direction of the second wiring substrate 70.

Therefore, when the uncured first mold material 80 is pressed to spread between the first wiring substrate 60 and the second wiring substrate 70, as long as it can be confirmed that the uncured first mold material 80 has passed through at least the light-transmission windows 75a, 75b, and 75c, it is possible to reliably confirm that the end portion 81 of the uncured first mold material 80 has extended up to a position further from the electro-optical device substrate 10 than the light-transmission windows 75a, 75b, and 75c, as indicated by an arrow P. In the pressing process, a situation is preferably avoided in which the uncured first mold material 80 is pushed out excessively from between the first wiring substrate 60 and the second wiring substrate 70, and contaminates and damages a jig or the like. Thus, it may be preferable to weaken the pressing force applied to an edge portion of the second wiring substrate 70. In this case, for example, the weakening of the pressing force can be realized by causing a head shape of the mechanical pressing device to be a shape in which a center portion thereof is high in the z-axis direction and a peripheral portion thereof is lower than the center portion in the z-axis direction. However, by doing so, the spread of the first mold material 80 tends to increase in a center portion of the second wiring substrate 70, and tends to decrease at the edge portion of the second wiring substrate 70. On the other hand, the second terminals 121 are arranged linearly in the x-axis direction. Therefore, in order to reliably spread the first mold material 80 to the second terminals 121, the pressing process is preferably performed with the head shape of the mechanical pressing device being formed in an arc-shape in which the center portion of the head protrudes in the y-axis direction. In other words, as described in the first exemplary embodiment, a mode is adopted in which a distance from the arc-shaped pressing portion to the second terminal 121 closest to the pressing portion is substantially equal to a distance from the pressing portion to the light-transmission window 75a, or a mode in which a distance from the pressing portion to the second terminal 121 closest to the pressing portion is slightly less than the distance from the pressing portion to the light-transmission window 75a. The light-transmission windows 75b and 75c are set in the same manner as the light-transmission window 75a. As described above, even when the head shape of the mechanical pressing device is optimized, in the present exemplary embodiment, the spread of the uncured first mold material 80 can be appropriately determined.

Third Exemplary Embodiment

Figure 5A:
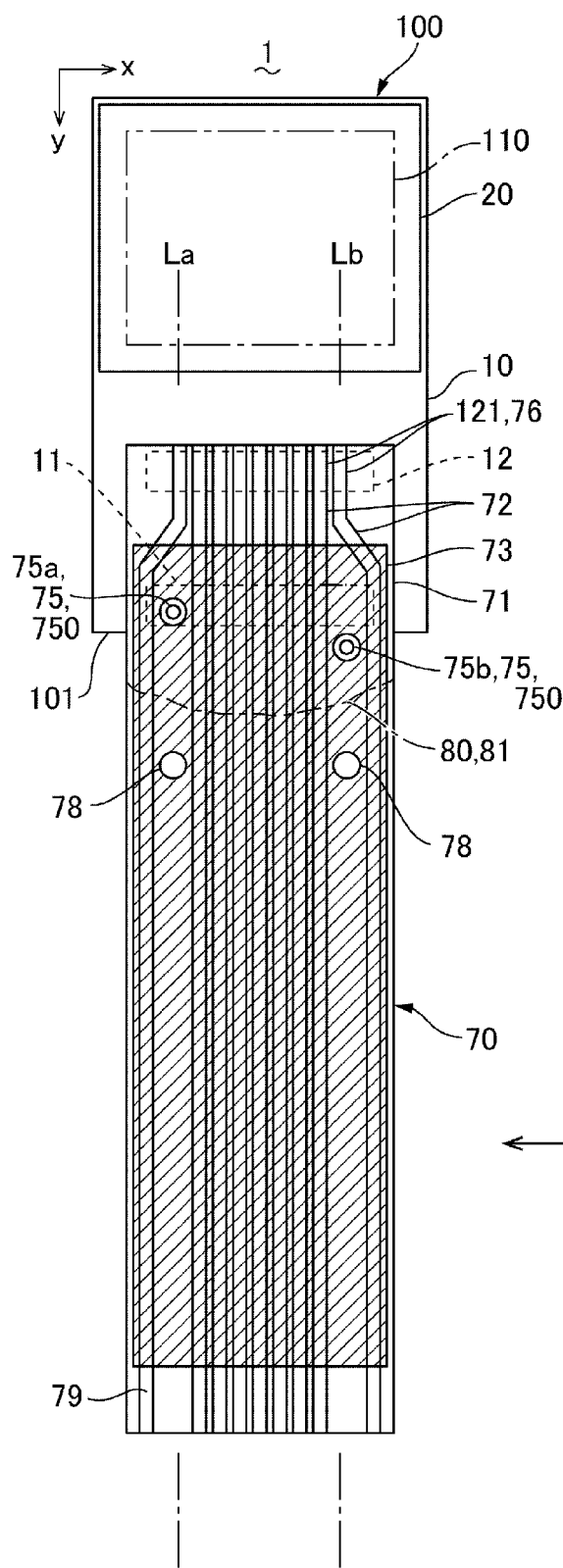
FIGS. 5A and 5B are explanatory diagrams each illustrating the electro-optical device according to a third exemplary embodiment of the present disclosure.
Figure 5B:
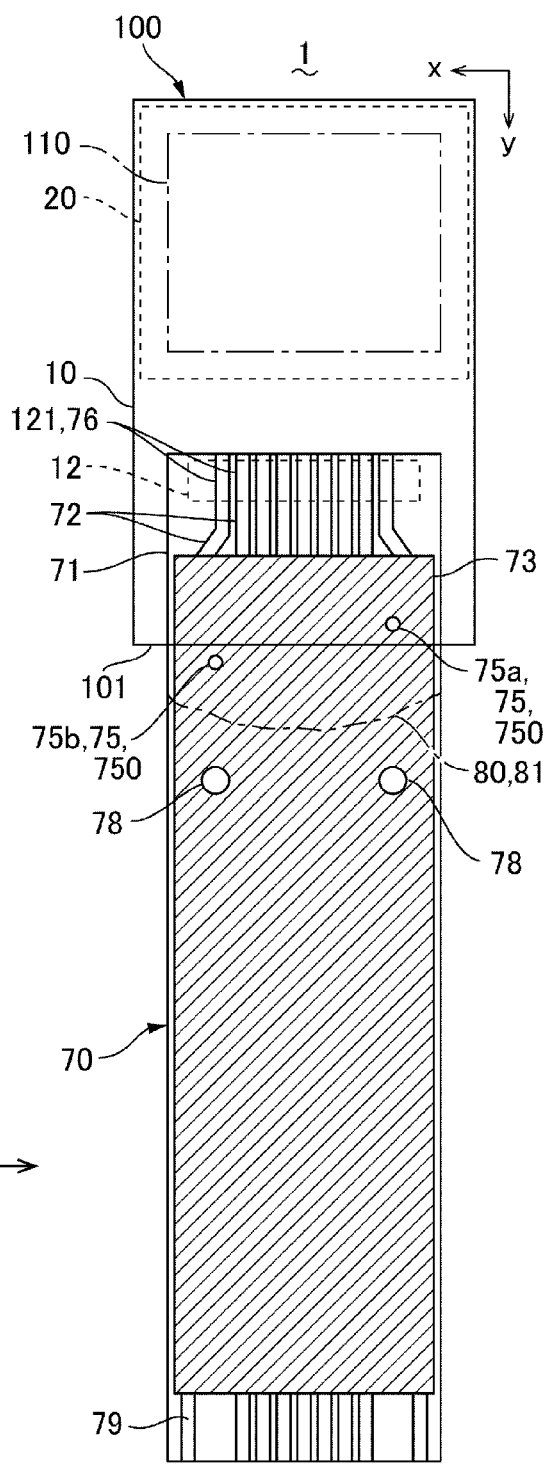

FIGS. 5A and 5B are explanatory diagrams of the electro-optical device 1 according to a third exemplary embodiment of the present disclosure. FIG. 5A illustrates a plan view of the second wiring substrate 70 and the like as viewed from the counter substrate 20 side, and FIG. 5B is a bottom surface view of the second wiring substrate 70 and the like as viewed from the electro-optical device substrate 10 side. In FIGS. 5A and 5B, the illustration of the first wiring substrate 60 is omitted. Further, in FIGS. 5A and 5B, visible portions of the second wiring substrate 70 are indicated by solid lines. Note that a basic configuration of the present exemplary embodiment is the same as that of the first exemplary embodiment, and thus, common portions will be denoted by the same reference signs and descriptions thereof will be omitted.

As illustrated in FIGS. 5A and 5B, similarly to the first exemplary embodiment, also in the present exemplary embodiment, the light-transmission windows 75 in which the wiring lines 72 and the protective layer 73 are not present in part are provided in the region overlapping with the first mold material 80, of the range in which the wiring lines 72 and the protective layer 73 are provided in the extending direction of the second wiring substrate 70. The light-transmission window 75 is the through hole 750 in which the base film 71 is not present.

Here, the light-transmission windows 75 are provided as the light-transmission windows 75a and 75b in two locations that are separated from each other in the width direction (the x-axis direction) that intersects with the extending direction (the y-axis direction) of the second wiring substrate 70. Further, the light-transmission windows 75 are provided in a plurality of locations that are separated from each other in the extending direction (the y-axis direction) of the second wiring substrate 70. More specifically, similarly to the first exemplary embodiment, the light-transmission window 75b is provided in a position overlapping with the electro-optical device substrate 10. In contrast, the light-transmission window 75a is provided in a position separated from the electro-optical device substrate 10. Therefore, as long as it can be confirmed that the uncured first mold material 80 has reached the positions in which the light-transmission windows 75a and 75b are provided, the sealing by the first mold material 80 can be performed appropriately in the extending direction of the second wiring substrate 70 as well. Since the light-transmission windows 75a and 75b are arranged so as to be separated from each other in the extending direction (the y-axis direction) of the second wiring substrate 70, "insufficient spread", "appropriate spread", and "excessive spread" of the first mold material 80 can be distinguished and determined. For example, when it cannot be confirmed that the first mold material 80 has reached the light-transmission window 75a, the determination of "insufficient spread" is made. When it can be confirmed that the first mold material 80 has reached the light-transmission window 75a, and it cannot be confirmed that the first mold material 80 has reached the light-transmission window 75b, the determination of "appropriate spread" is made. When it can be confirmed that the first mold material 80 has reached the light-transmission window 75a, and it can be confirmed that the first mold material 80 has reached the light-transmission window 75b, the determination of "excessive spread" is made. By providing the above-described determination criteria, a production device used for a filling process or the pressing process of the first mold material 80 can be optimally adjusted.

Fourth Exemplary Embodiment

Figure 6:
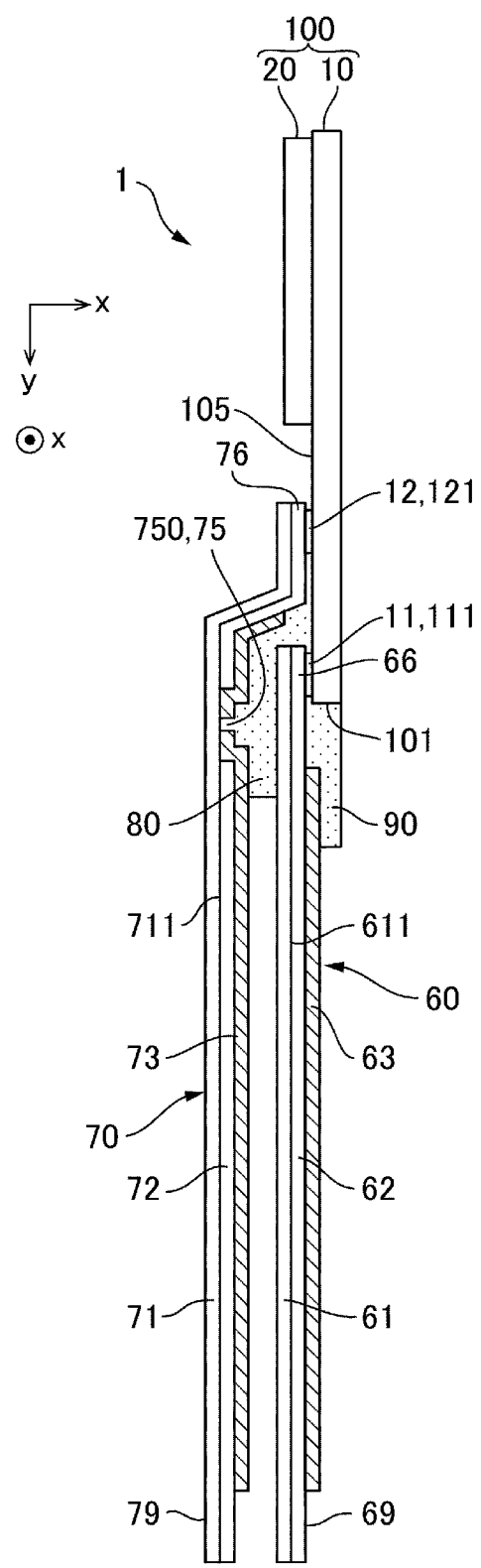
FIG. 6 is an explanatory diagram illustrating the electro-optical device according to a fourth exemplary embodiment of the present disclosure.

FIG. 6 is an explanatory diagram illustrating the electro-optical device 1 according to a fourth exemplary embodiment of the present disclosure, and corresponds to the cross-sectional view illustrated in FIG. 2. Note that a basic configuration of the present exemplary embodiment is the same as that of the first exemplary embodiment, and thus, common portions will be denoted by the same reference signs and descriptions thereof will be omitted.

In the first to third exemplary embodiments, the light-transmission window 75 is the through hole 750 in which the base film 71 is not present, but as illustrated in FIG. 6, the base film 71 may be present in the light-transmission window 75. In this case, in the light-transmission window 75, the base film 71 is in contact with the air until the uncured first mold material 80 reaches the light-transmission window 75, but when the uncured first mold material 80 reaches the light-transmission window 75, the base film 71 comes into contact with the uncured first mold material 80. Therefore, since optical properties at an interface of the base film 71 change depending on the presence or absence of the first mold material 80, even when the light-transmission window 75 is not a through hole, it is possible to determine whether or not the uncured first mold material 80 has reached the light-transmission window 75. As a modified example, by forming the light-transmission window 75 to have a shape that is long in the extending direction (the y-axis direction) of the second wiring substrate 70, for example, the end portion 81 of the first mold material 80 can be observed, and thus, the first mold material 80 may be transparent or opaque. This configuration in which the base film 71 is left in the light-transmission window 75 can also be applied to the configuration in which the wiring layers are provided at both sides of the second wiring substrate 70. Specifically, with respect to the protective layer formed on the one surface of the base film and the protective layer formed on the other surface of the base film, both the protective layers are removed in the same section in plan view, and a light-transmission window is configured with the base film left in the light-transmission window.

In addition, since the light-transmission window 75 is not a through hole, a situation is unlikely to occur in which the uncured first mold material 80 leaks out from the light-transmission window 75 and stains the periphery of the head of the mechanical pressing device. Since the head of the mechanical pressing device is not contaminated by the uncured first mold material 80, a frequency of periodic cleaning can be reduced, and production efficiency is thus improved.

Fifth Exemplary Embodiment

Figure 7:
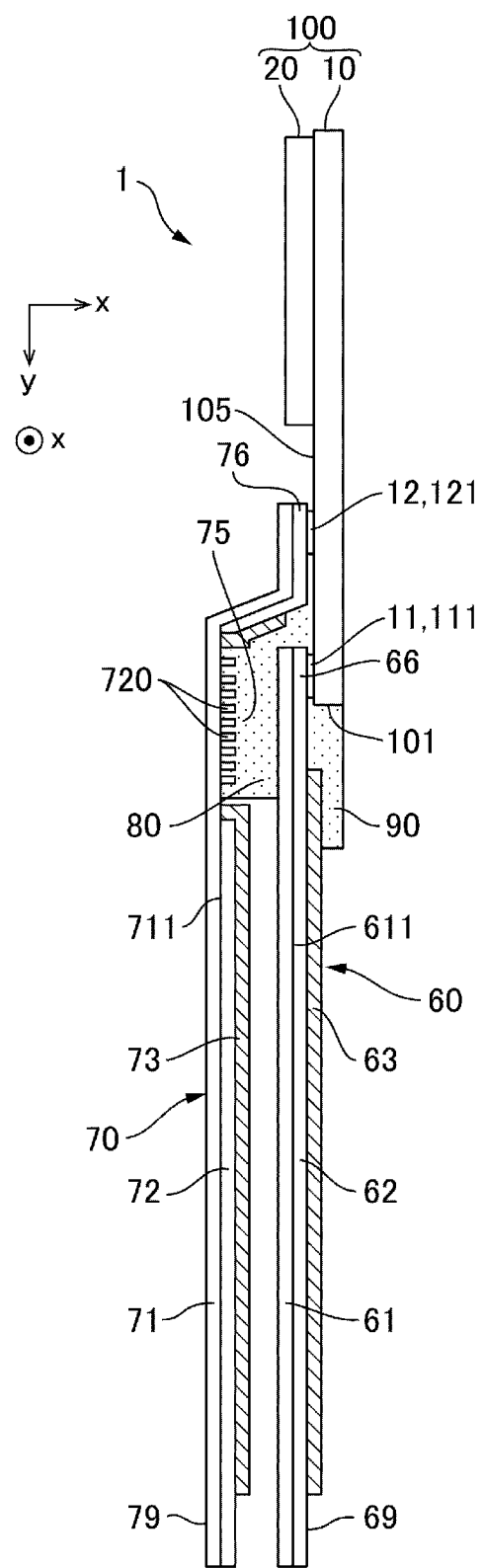
FIG. 7 is an explanatory diagram schematically illustrating a cross-section of the electro-optical device according to a fifth exemplary embodiment of the present disclosure.
Figure 8A:
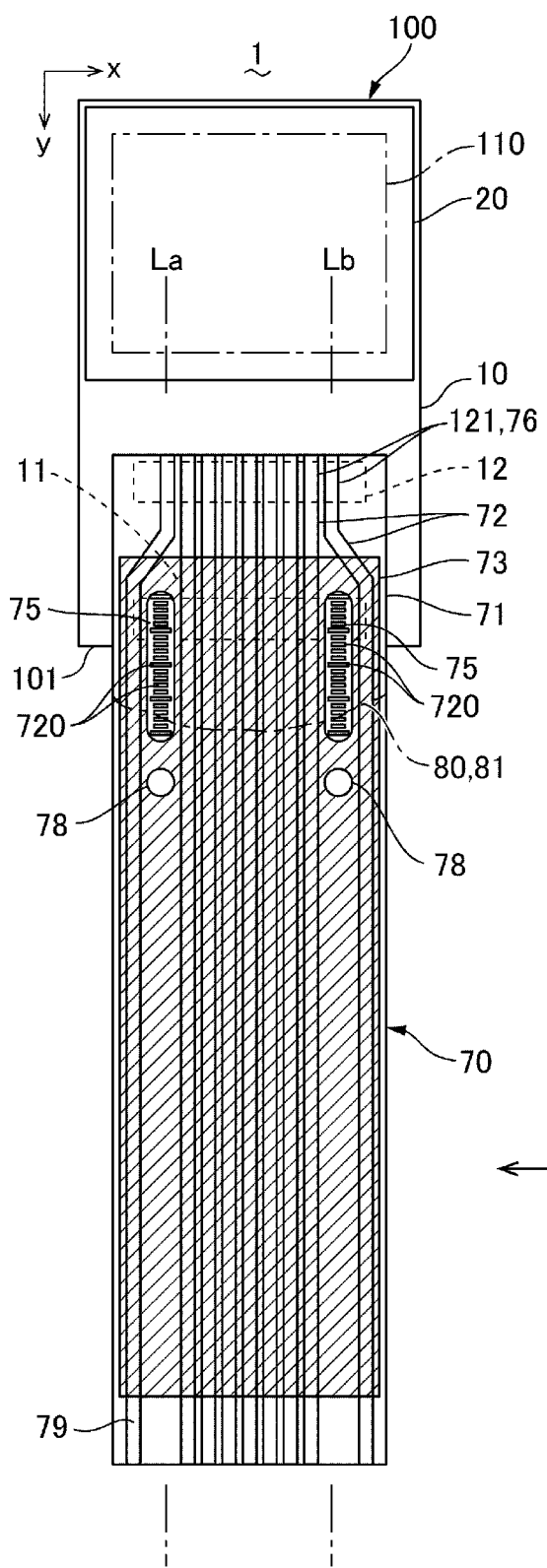
FIGS. 8A and 8B are explanatory diagrams each illustrating a planar configuration of the electro-optical device illustrated in FIG. 7.
Figure 8B:
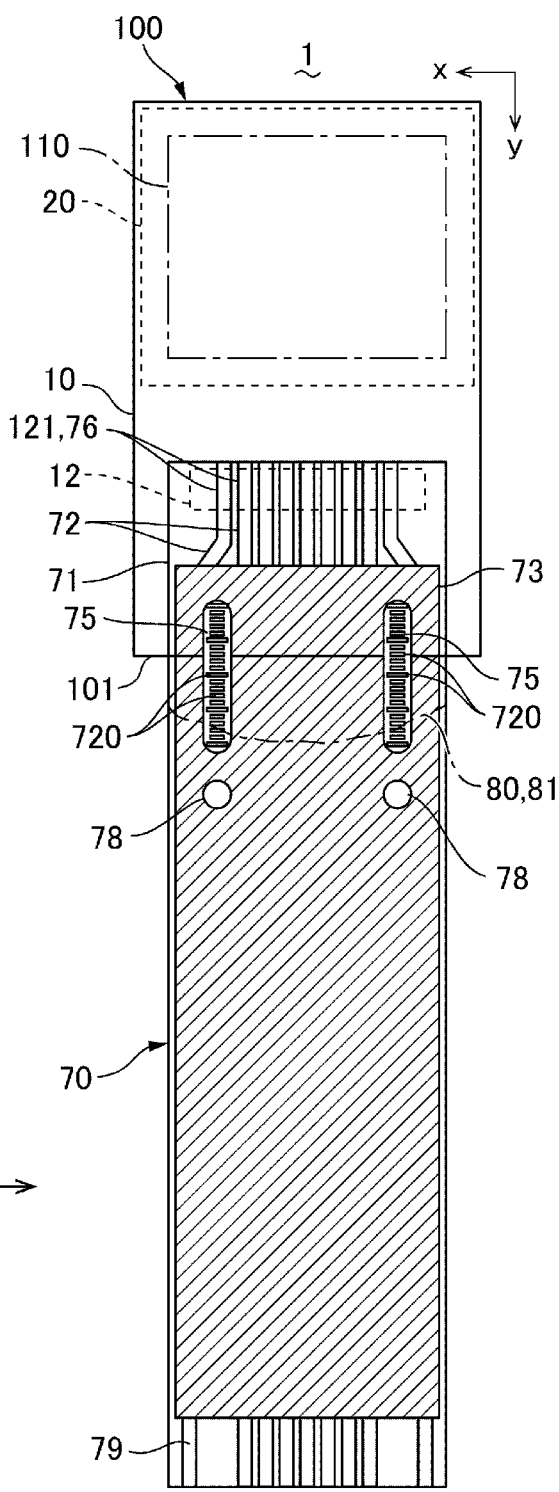

FIG. 7 is an explanatory diagram schematically illustrating a cross-section of the electro-optical device 1 according to a fifth exemplary embodiment of the present disclosure. FIGS. 8A and 8B are explanatory diagrams each illustrating a planar configuration of the electro-optical device 1 illustrated in FIG. 7. FIG. 8A illustrates a plan view of the second wiring substrate 70 and the like as viewed from the counter substrate 20 side, and FIG. 8B illustrates a bottom surface view of the second wiring substrate 70 and the like as viewed from the electro-optical device substrate 10 side. In FIGS. 8A and 8B, the illustration of the first wiring substrate 60 is omitted. Further, in FIGS. 8A and 8B, visible portions of the second wiring substrate 70 are indicated by solid lines. Note that a basic configuration of the present exemplary embodiment is the same as that of the first exemplary embodiment, and thus, common portions will be denoted by the same reference signs and descriptions thereof will be omitted.

As illustrated in FIG. 7, in the electro-optical device 1 of the present exemplary embodiment also, similarly to the fourth exemplary embodiment, the base film 71 is present in the light-transmission window 75. In the present exemplary embodiment, as illustrated in FIG. 7 and FIGS. 8A and 8B, the light-transmission window 75 is a long hole whose major axis extends along the extending direction of the second wiring substrate 70, where each of short sides thereof is from 0.2 mm to 0.4 mm and each of long sides thereof is from 1 mm to 3 mm, for example. In the light-transmission window 75, a plurality of metal films 720, which are the same material as the wiring lines 72, are provided along the extending direction. In the present exemplary embodiment, in the light-transmission window 75, the plurality of metal films 720 are provided along the extending direction at equal intervals in a graduated manner, where the interval therebetween is set to be from 0.1 mm to 0.5 mm, for example. Therefore, in the light-transmission window 75, the position of the end portion 81 of the uncured first mold material 80 can be observed with reference to the plurality of metal films 720. The observation is performed, for example, by using a magnifying imaging device and quantifying the position of the end portion 81 of the first mold material 80 using image analysis.

More specifically, as illustrated in FIGS. 8A and 8B, based on which of the metal films 720, of the plurality of metal films 720, the end portion of 81 of the uncured first mold material 80 overlaps with, it is possible to confirm the range in which the uncured first mold material 80 is provided. Therefore, based on the observation result at the light-transmission window 75, the uncured first mold material 80 can be provided in the appropriate range, and thus, the sealing by the first mold material 80 can be performed appropriately in the extending direction of the second wiring substrate 70. Since the light-transmission window 75 is the long hole whose major axis extends along the extending direction of the second wiring substrate 70, the end portion 81 of the first mold material 80 can be observed, and the position of the end portion 81 of the first mold material 80 can be quantified using the graduations formed by the metal films 720. Based on the observation result, the production device used for the filling process or the pressing process of the first mold material 80 can be adjusted.

Sixth Exemplary Embodiment

Figure 9:
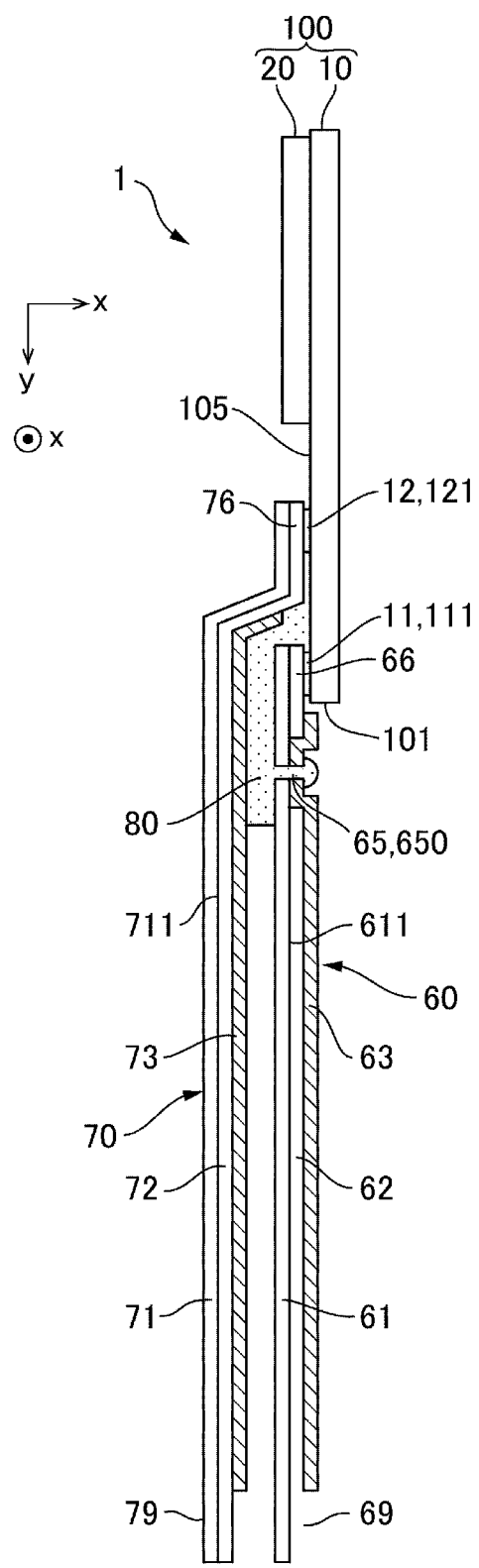
FIG. 9 is an explanatory diagram illustrating the electro-optical device according to a sixth exemplary embodiment of the present disclosure.

FIG. 9 is an explanatory diagram illustrating the electro-optical device 1 according to a sixth exemplary embodiment of the present disclosure, and corresponds to the cross-sectional view illustrated in FIG. 2. Note that a basic configuration of the present exemplary embodiment is the same as that of the first exemplary embodiment, and thus, common portions will be denoted by the same reference signs and descriptions thereof will be omitted.

Although the light-transmission windows 75 are formed in the second wiring substrate 70 in the first to fifth exemplary embodiments, as illustrated in FIG. 9, a mode may be adopted in which a light-transmission window 65 in which the wiring lines 62 and the protective layer 63 are not present in part is provided in the first wiring substrate 60, in the region overlapping with the first mold material 80, of a range in which the wiring lines 62 and the protective layer 63 are provided in the extending direction of the first wiring substrate 60. Here, the light-transmission window 65 is a through hole 650 in which the base film 61 does not exist, and a portion of the first mold material 80 protrudes from the light-transmission window 65 (a through hole 650) toward the opposite side from the second wiring substrate 70.

In the present exemplary embodiment, before the application of the second mold material 90, which is described above with reference to FIG. 2 and the like, the uncured first mold material 80 is applied between the first wiring substrate 60 and the second wiring substrate 70, and thereafter, the uncured first mold material 80 is caused to spread by pressing the first wiring substrate 60 and the second wiring substrate 70 so as to be closer to each other. At this time, by observing the first mold material 80 from the first wiring substrate 60 side via the light-transmission window 65, it is possible to confirm whether or not the uncured first mold material 80 has reached a position further separated from the electro-optical device substrate 10 than the position of the light-transmission window 65. Thus, the sealing by the first mold material 80 can be appropriately performed.

Note that in the present exemplary embodiment also, as described in the fourth exemplary embodiment, the base film 61 may be present in the light-transmission window 65. Further, as described in the fifth exemplary embodiment, a plurality of metal films, which are the same as the wiring lines 62, may be provided in the light-transmission window 65 in a graduated manner.

Other Exemplary Embodiments

In the above-described exemplary embodiments, the electro-optical device 1 is the liquid crystal device. However, the present disclosure may be applied to a case in which the electro-optical device 1 is an organic electroluminescence device.

Example of Installation in Electronic Apparatus

Figure 10:
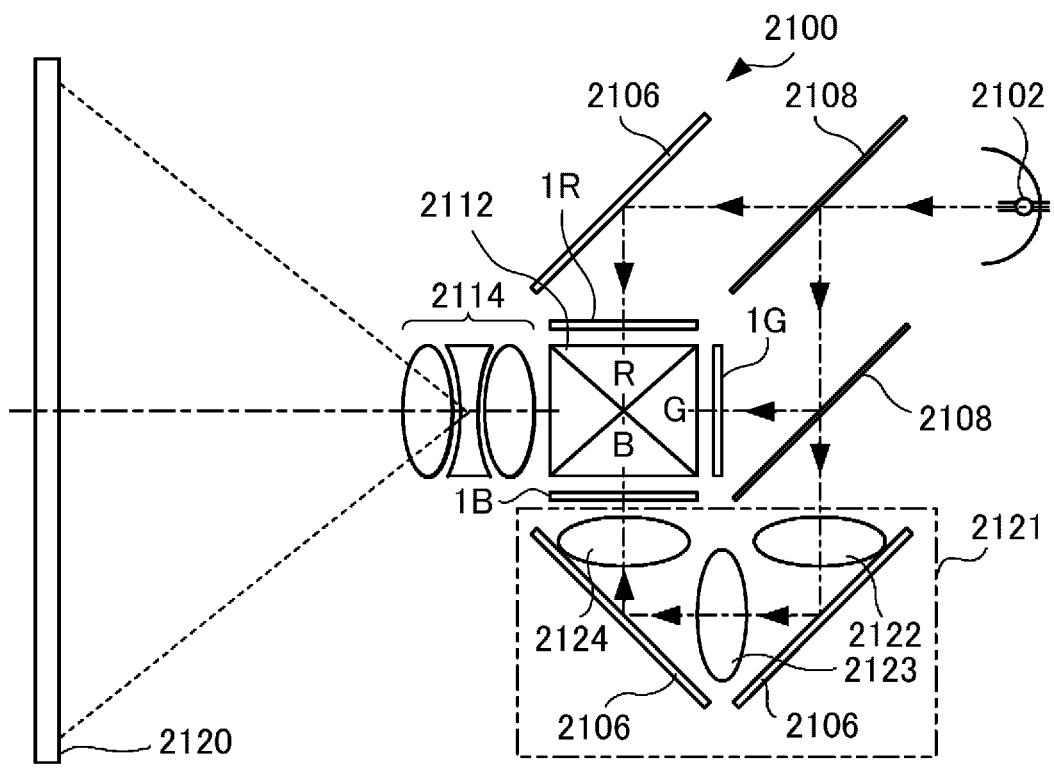
FIG. 10 is a schematic configuration view of a projection-type display device using the electro-optical device to which the present disclosure is applied.

An electronic apparatus using the electro-optical device 1 according to the above-described exemplary embodiments will be described below. FIG. 10 is a schematic configuration view of a projection-type display apparatus (the electronic apparatus) using the electro-optical device 1 to which the present disclosure is applied. A projection-type display apparatus 2100 illustrated in FIG. 10 is an example of the electronic apparatus using the electro-optical device 1. The projection-type display device 2100, in which the electro-optical device 1 is used as a light valve, can perform high-definition and bright display without making the apparatus large. As illustrated in FIG. 10, a lamp unit 2102 (a light-source unit) including a white light source such as a halogen lamp is provided inside the projection-type display apparatus 2100. Projection light emitted from the lamp unit 2102 is split into three primary colors of R (red), G (green), and B (blue) by three mirrors 2106 and two dichroic mirrors 2108 disposed internally. The split projection light is respectively guided to light valves 1R, 1G, and 1B corresponding to each of the primary colors. Note that since the B color light has a longer optical path than that of the R color light and the G color light, in order to prevent a loss of the B color light, the B color light is guided via a relay lens system 2121 that includes an incidence lens 2122, a relay lens 2123, and an emission lens 2124.

In the projection-type display apparatus 2100, the configuration of each of the light valves 1R, 1G, and 1B is the same as that of the electro-optical device 1 described with reference to FIG. 1 and the like, and each of the light valves 1R, 1G, and 1B is coupled to an upper circuit provided inside the projection-type display apparatus 2100 via the first wiring substrate 60 and the second wiring substrate 70 illustrated in FIG. 1 and the like. Image signals specifying gray-scale levels of respective primary color components of the R color, the G color, and the B color are supplied from an external upper circuit and processed by the upper circuit inside the projection-type display device 2100 to drive the light valves 1R, 1G, and 1B, respectively. Light modulated by each of the light valves 1R, 1G, and 1B is incident on a dichroic prism 2112 from three directions. Then, at the dichroic prism 2112, the R color light and the B color light are reflected at 90 degrees, and the G color light is transmitted. As a result, images of each of the primary colors are synthesized, and thereafter, a color image is projected on a screen 2120 by a projection lens group 2114 (a projection optical system).

Other Projection-Type Display Apparatuses

Note that the projection-type display apparatus may include a configuration in which an LED light source or the like configured to emit light of each color is used as a light source unit and the light of each color emitted from the LED light source is supplied to another liquid-crystal device.

Other Electronic Apparatuses

The electronic apparatus including the electro-optical device 1 to which the present disclosure is applied is not limited to the projection-type display device 2100 of the above-described exemplary embodiment. Examples of the electronic apparatus may include a projection-type head up display (HUD), a direct-view-type head mounted display (HMD), a personal computer, a digital still camera, and a liquid crystal television.

What is claimed is:
1. An electro-optical device comprising:
an electro-optical device substrate including
a plurality of pixel electrodes arranged in a pixel region,
a first terminal region in which a plurality of first terminals are arranged between a substrate edge and the pixel region, along the substrate edge, and
a second terminal region in which a plurality of second terminals are arranged between the first terminal region and the pixel region, along the substrate edge;
a flexible first wiring substrate coupled to the first terminal region;
a flexible second wiring substrate coupled to the second terminal region, and extending while overlapping with the first wiring substrate; and
a first mold material provided from between the first wiring substrate and the second wiring substrate to between the first terminal region and the second terminal region, wherein
each of the first wiring substrate and the second wiring substrate includes a base film having transmissivity, a wiring line provided at the base film, and a protective layer that covers the wiring line and is less transmissive than the base film, and
one wiring substrate of the first wiring substrate and the second wiring substrate is provided with a light-transmission window in which the wiring line and the protective layer are not present in part, the light-transmission window being provided in a region overlapping with the first mold material in a range in which the protective layer and the wiring line are provided in an extending direction of the one wiring substrate.

2. An electro-optical device comprising:
an electro-optical device substrate including
a plurality of pixel electrodes arranged in a pixel region,
a first terminal region in which a plurality of first terminals are arranged between a substrate edge and the pixel region, along the substrate edge, and
a second terminal region in which a plurality of second terminals are arranged between the first terminal region and the pixel region, along the substrate edge;
a flexible first wiring substrate coupled to the first terminal region;
a flexible second wiring substrate coupled to the second terminal region, and extending while overlapping with the first wiring substrate; and
a first mold material provided from between the first wiring substrate and the second wiring substrate to between the first terminal region and the second terminal region, wherein
each of the first wiring substrate and the second wiring substrate includes a base film, a wiring line provided at the base film, and a protective layer covering the wiring line, and
one wiring substrate of the first wiring substrate and the second wiring substrate is provided with a light-transmission window formed by a through hole, the light-transmission window being provided in a region overlapping with the first mold material in a range in which the protective layer and the wiring line are provided in an extending direction of the one wiring substrate.

3. The electro-optical device according to claim 1, wherein
the one wiring substrate is the second wiring substrate.

4. The electro-optical device according to claim 1, wherein
the light-transmission window is provided in a plurality of locations that are separated from each other in at least a width direction intersecting the extending direction.

5. The electro-optical apparatus according to claim 4, wherein
the plurality of locations include a position on a virtual straight line extending along the extending direction from the second terminal positioned at one end, in the width direction, of the second terminal region, and a position on a virtual straight line extending along the extending direction from the second terminal positioned at another end, in the width direction, of the second terminal region.

6. The electro-optical device according to claim 1, wherein
the light-transmission window is provided in a plurality of locations that are separated from each other in at least the extending direction.

7. The electro-optical device according to claim 1, wherein
a plurality of metal films that are the same material as the wiring line are provided in the light-transmission window along the extending direction.

8. The electro-optical device according to claim 7, wherein
the plurality of metal films are provided at a constant interval in the light-transmission window along the extending direction.

9. The electro-optical device according to claim 1, wherein
the protective layer is colored.

10. The electro-optical device according to claim 1, wherein
each of the first wiring substrate and the second wiring substrate includes the wiring line provided at a surface, on a side of the electro-optical device substrate, of the base film.

11. The electro-optical device according to claim 1, wherein
a second mold material is provided, on a side of the first wiring substrate opposite from the second wiring substrate, from a region of the first wiring substrate exposed from the electro-optical device substrate to the first terminal region.

12. An electronic apparatus comprising:
the electro-optical device according to claim 1.

* * * * *